United States Patent
Yamazaki et al.

(10) Patent No.: US 10,468,375 B2
(45) Date of Patent: Nov. 5, 2019

(54) SEMICONDUCTOR DEVICE AND METHOD FOR MANUFACTURING SAME

(71) Applicant: MITSUBISHI ELECTRIC CORPORATION, Chiyoda-ku (JP)

(72) Inventors: Koji Yamazaki, Chiyoda-ku (JP); Tomoaki Kato, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 16/302,822

(22) PCT Filed: Dec. 13, 2016

(86) PCT No.: PCT/JP2016/087071
§ 371 (c)(1),
(2) Date: Nov. 19, 2018

(87) PCT Pub. No.: WO2018/008168
PCT Pub. Date: Jan. 11, 2018

(65) Prior Publication Data
US 2019/0221540 A1    Jul. 18, 2019

(30) Foreign Application Priority Data
Jul. 4, 2016  (JP) .................................. 2016-132321

(51) Int. Cl.
*H01L 23/00* (2006.01)
*H01L 23/13* (2006.01)
(Continued)

(52) U.S. Cl.
CPC ........ *H01L 24/83* (2013.01); *H01L 21/28556* (2013.01); *H01L 21/52* (2013.01);
(Continued)

(58) Field of Classification Search
None
See application file for complete search history.

(56) References Cited

U.S. PATENT DOCUMENTS 4,978,052 A * 12/1990 Fister ................ H01L 23/49866
156/325
2006/0244148 A1   11/2006 Lu
(Continued)

FOREIGN PATENT DOCUMENTS

DE   10 2015 105 666 A1   10/2016
EP       2 506 316 A1     10/2012
(Continued)

OTHER PUBLICATIONS

International Search Report dated Mar. 14, 2017 in PCT/JP2016/087071 filed on Dec. 13, 2016.
(Continued)

*Primary Examiner* — Shaun M Campbell
(74) *Attorney, Agent, or Firm* — Oblon, McClelland, Maier & Neustadt, L.L.P.

(57) ABSTRACT

A method of manufacturing a semiconductor device of the present disclosure includes the steps of sequentially forming an adhesion-improving film, a Pt film, a Sn film, and an Au film on a semiconductor wafer through vapor deposition; dicing the semiconductor wafer to obtain a semiconductor element; sequentially forming a Ni film and an Au film on a substrate through vapor deposition; and laminating the semiconductor element and the substrate so that the Au film formed on the semiconductor element and the Au film formed on the substrate face each other, followed by joining the semiconductor element and the substrate through heating.

18 Claims, 1 Drawing Sheet

(51) Int. Cl.
  *H01L 21/52* (2006.01)
  *H01L 21/285* (2006.01)
  *H01L 21/78* (2006.01)
  *H01L 29/16* (2006.01)

(52) U.S. Cl.
  CPC .............. *H01L 21/78* (2013.01); *H01L 23/13* (2013.01); *H01L 24/27* (2013.01); *H01L 24/29* (2013.01); *H01L 29/1608* (2013.01); *H01L 2224/27452* (2013.01); *H01L 2224/29155* (2013.01); *H01L 2224/29666* (2013.01); *H01L 2224/8384* (2013.01); *H01L 2224/83193* (2013.01); *H01L 2924/0105* (2013.01); *H01L 2924/01028* (2013.01); *H01L 2924/0134* (2013.01); *H01L 2924/01078* (2013.01); *H01L 2924/01079* (2013.01)

(56) References Cited

U.S. PATENT DOCUMENTS

2014/0312361 A1* 10/2014 Ohtsu ..................... H01L 24/83
    257/77
2015/0047879 A1* 2/2015 Shibuya .................. C23C 14/14
    174/126.2
2015/0266137 A1* 9/2015 Choudhury .......... B23K 1/0016
    420/561
2016/0035691 A1 2/2016 Yamazaki et al.

FOREIGN PATENT DOCUMENTS

| | | |
|---|---|---|
| EP | 3 057 123 A1 | 8/2016 |
| JP | 63-110751 A | 5/1988 |
| JP | 2000-288770 A | 10/2000 |
| JP | 2010-99726 A | 5/2010 |
| JP | 2012-28613 A | 2/2012 |
| JP | 2012-54358 A | 3/2012 |
| WO | WO 2015/004956 A1 | 1/2015 |
| WO | WO 2015/053193 A1 | 4/2015 |

OTHER PUBLICATIONS

Japanese Notification of Reasons for Refusal dated Aug. 29, 2017 in Japanese Application 2017-525648, (with English translation).
Office Action dated Mar. 29, 2019 in German Patent Application No. 11 2016 006 934.0, 8 pages (with English translation).

* cited by examiner (a)   (b)   (c)

SEMICONDUCTOR DEVICE AND METHOD FOR MANUFACTURING SAME

TECHNICAL FIELD

The present invention relates to a semiconductor device and a method of manufacturing the semiconductor device.

BACKGROUND ART

In recent years, there is an increasing demand for reliability in semiconductor devices in which a semiconductor element is mounted on a substrate. In particular, there is a strong demand for an increase in reliability of a joining portion (hereinafter referred to as "joint reliability") between the semiconductor element and the substrate, which have a large difference in thermal expansion coefficients.

In general, silicon (Si) or gallium arsenide (GaAs) having an operating temperature of from 100° C. to 125° C. has hitherto been used for the semiconductor element. A joining material to be used for the joining portion between the semiconductor element and the substrate is required to have crack resistance against repetitive thermal stress resulting from the difference in thermal expansion coefficients between the semiconductor element and the substrate, have such heat resistance (high melting point) as to respond to multi-stage joining at the time of assembly, and have a property of not contaminating the semiconductor device. In order to satisfy such requirements, for example, lead-containing solder typified by 95Pb-5Sn solder (containing 95 mass % of Pb and 5 mass % of Sn) is mainly used as the joining material when Si is used for the semiconductor element. Alternatively, for example, Au-containing solder typified by 80Au-20Sn solder (containing 80 mass % of Au and 20 mass % of Sn) is mainly used as the joining material when GaAs is used for the semiconductor element. However, the 95Pb-5Sn solder, which contains large amounts of hazardous lead (Pb), has a problem from the viewpoint of reducing environmental load. In addition, development of alternatives to the 80Au-20Sn solder is strongly desired from the viewpoint of rising prices of noble metals and their reserves.

In addition, from the viewpoint of energy saving, as next-generation devices, semiconductor devices using silicon carbide (SiC) and gallium nitride (GaN) for semiconductor elements have been actively developed. Those semiconductor devices each have an operating temperature of 175° C. or more from the viewpoint of reducing power loss, and the operating temperature is said to be increased to 250° C. in the future. In order to respond to such high operating temperature, attention has been focused on a sinterable metal or a joining material called metal paste containing nano-sized or micro-sized metal particles and an organic solvent (for example, see Patent Documents 1 and 2). In the joining material, the organic solvent is decomposed at the time of heat treatment, and thus the metal particles are sintered with each other to form a joining portion. After the sintering (joining), the joining portion has a temperature limit comparable to the melting point of the metal particles (e.g., 960° C. in the case of silver). The organic solvent decomposes at from about 200° C. to about 300° C. depending on the kind of organic solvent. Therefore, objects to be joined can be joined to each other at a temperature at which the objects are not degraded. Further, after the joining, high heat resistance can be achieved. As the metal particles, silver is generally used from the viewpoint of heat release properties, oxidation resistance, and cost. Other than silver, gold, copper, or nickel is used as the metal particles. However, gold, copper, and nickel are inferior to silver in cost, in a reduction in sintering density due to oxidation, and in a reduction in sintering density due to oxidation and heat release properties, respectively.

However, silver is a metal easily sulfurized. Although a semiconductor device manufacturing plant often includes a clean room, which is a region in which temperature and humidity are controlled, in developing countries, the air environment is poor, and silver is sometimes sulfurized to be discolored owing to automobile exhaust gas or the like before a member is carried into a clean room. In addition, when a clean room has an insufficient structure, silver is sulfurized or oxidized after being affected by the air environment even in the clean room, resulting in a remarkable reduction in yield at the time of mass production.

In view of the foregoing, as a joining material that is free of silver and provides a joining portion having a high temperature limit, there has been proposed a joining material that contains Au and Sn as main components and has added thereto a metal, for example, Pt (for example, see Patent Document 3).

Meanwhile, there is also a demand for an increase in mass production properties of semiconductor devices. Herein, a semiconductor device having good mass production properties mainly means that, in the production of the semiconductor device, a facility in association with joining is simple, storage of a member is easy, the number of steps is small, and talk time is short.

The mass production properties of a semiconductor device depend on the form of the joining material to be used. Paste forms, foil forms, sheet forms, or the like have generally been known as the form of the joining material.

A joining material in a paste form contains a flux, and hence joining can be performed in an atmospheric atmosphere. However, the joining material in a paste form contains a solvent, and hence must be stored in a refrigerator. Further, a printing device for printing the joining material in a paste form and a printing step involving using the printing device are required. Therefore, every time the size of the semiconductor element changes, a dedicated printing plate or the like is required. Moreover, even when the joining material in a paste form itself has low cost, the overall cost is increased owing to the control of the printing step and the use of the printing device. In addition, a joining portion obtained through use of the joining material in a paste form generally has low heat resistance, and hence the thickness of the joining portion must be increased in order to relax shear stress generated from a difference in thermal expansion coefficient between members. However, when the thickness of the joining portion is increased, voids are liable to be generated in the joining portion, and also heat release properties are reduced. When the joining material as described in Patent Document 1 is used, a joining portion excellent in heat resistance is obtained. However, in order to increase joint reliability and heat release properties, the denseness of the metal particles must be increased through pressurization. Accordingly, an expensive high temperature furnace having a pressurization mechanism is required, resulting in an increase in cost.

When a joining material in a foil form or a sheet form is used, joining can be performed with only a simple mounting operation without the necessity for the printing step. However, a mounting device for performing the mounting operation is required. In addition, the joining material in a foil form or a sheet form is free of a flux, and hence the joining must be performed in a reducing gas, resulting in an increase in the overall cost owing to the use of an expensive high temperature furnace for use with a reducing gas.

Meanwhile, a method of forming a joint film through vapor deposition can eliminate the need for the mounting or printing of the joining material, and hence can achieve a reduction in the number of steps. In addition, although there is an impression that vapor deposition has higher costs than printing, the cost per semiconductor element is inexpensive as compared to that in the case of printing when the vapor deposition is performed on a semiconductor wafer in a mass production stage. In addition, vapor deposition also has the advantages of fewer variations in film thickness and high stability.

CITATION LIST

Patent Document

[Patent Document 1] JP 2012-54358 A
[Patent Document 2] JP 2012-28613 A
[Patent Document 3] JP 2010-99726 A

SUMMARY OF INVENTION

Technical Problem

The present invention has been made to solve the above-mentioned problems, and an object of the present invention is to provide a semiconductor device that has high mass production properties and has excellent joint reliability even at a high temperature of 250° C., and a method of manufacturing the semiconductor device.

Solution to Problem

The inventors of the present invention have focused attention on a method of forming a joint film through evaporation from the viewpoint of mass production properties, and as a result, have found that all the above-mentioned problems can be solved by forming a specific joint film optimized for the method through vapor deposition, followed by joining through heating. Thus, the present invention has been completed.

That is, according to one embodiment of the present invention, there is provided a method of manufacturing a semiconductor device including the steps of: sequentially forming an adhesion-improving film, a Pt film, a Sn film, and a Au film on a semiconductor wafer through vapor deposition so that a metal laminated film formed of the Pt film, the Sn film, and the Au film includes 5 mass % or more and less than 10 mass % of the Pt film and 51 mass % or more and less than 75 mass % of the Au film, with the balance being the Sn film; dicing the semiconductor wafer to obtain a semiconductor element; sequentially forming a Ni film and a Au film on a substrate through vapor deposition; and laminating the semiconductor element and the substrate so that the Au film formed on the semiconductor element and the Au film formed on the substrate face each other, followed by joining the semiconductor element and the substrate through heating.

Further, according to one embodiment of the present invention, there is provided a semiconductor device including a substrate and a semiconductor element joined to each other via a joining portion, wherein the semiconductor device has formed, between the substrate and the joining portion, a Ni film and, between the semiconductor element and the joining portion, an adhesion-improving film, and wherein the joining portion includes 4.5 mass % or more and 9 mass % or less of Pt, 46.8 mass % or more and 69 mass % or less of Au, 16 mass % or more and 40.5 mass % or less of Sn, and 5 mass % or more and 8.5 mass % or less of Ni.

Advantageous Effects of Invention

According to the present invention, a semiconductor device which has high mass production properties and is excellent in joint reliability even at a high temperature of 250° C., and a method of manufacturing the semiconductor device can be provided.

DESCRIPTION OF EMBODIMENTS

A description is now given of a semiconductor device and a method of manufacturing the semiconductor device according to preferred embodiments of the present invention referring to the accompanying drawings.

First Embodiment

According to a first embodiment, a method of manufacturing a semiconductor device includes the steps of: sequentially forming an adhesion-improving film, a Pt film, a Sn film, and a Au film on a semiconductor wafer through vapor deposition; dicing the semiconductor wafer to obtain a semiconductor element; sequentially forming a Ni film and a Au film on a substrate through vapor deposition; and laminating the semiconductor element and the substrate so that the Au film formed on the semiconductor element and the Au film formed on the substrate face each other, followed by joining the semiconductor element and the substrate through heating.

Figure 1:
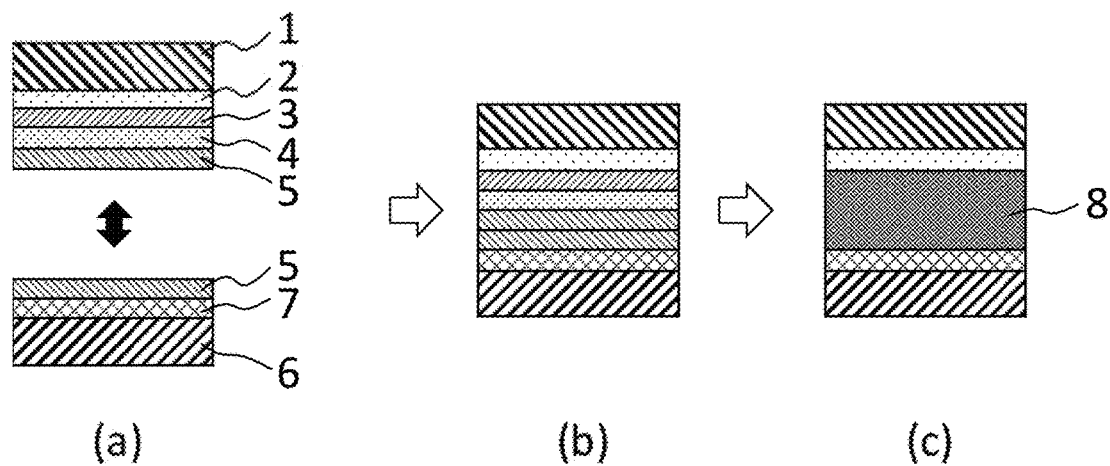
FIG. 1 is a schematic view for illustrating a method of manufacturing a semiconductor device according to a first embodiment.

FIG. 1 is a schematic view for illustrating the method of manufacturing a semiconductor device according to this embodiment.

FIG. 1(a) is a view for illustrating: a semiconductor element 1, on which an adhesion-improving film 2, a Pt film 3, a Sn film 4, and a Au film 5 are sequentially formed; and a substrate 6, on which a Ni film 7 and a Au film 5 are sequentially formed. FIG. 1(b) is a view for illustrating a state in which the Au film 5 formed on the semiconductor element 1 and the Au film 5 formed on the substrate 6 are laminated on each other so that the Au films 5 face each other. FIG. 1(c) is a view for illustrating a state in which a joining portion 8 is formed by subjecting a laminate of FIG. 1B to joining through heating.

The semiconductor element 1 illustrated in FIG. 1(a) can be obtained by sequentially forming the adhesion-improving film 2, the Pt film 3, the Sn film 4, and the Au film 5 on a semiconductor wafer through vapor deposition, followed by dicing the semiconductor wafer.

A material for the semiconductor wafer is not particularly limited, and any material known in the art may be used. Examples of the material for the semiconductor wafer include Si (silicon), GaAs (gallium arsenide), SiC (silicon carbide), GaN (gallium nitride), and diamond. Of those, wide-bandgap semiconductors, such as SiC, GaN, and diamond, which enable high-temperature operation and are useful for next-generation devices, are preferred, and SiC is particularly preferred.

As the adhesion-improving film 2 to be formed on the semiconductor wafer, any metal film known in the art capable of improving adhesiveness between the semiconductor wafer and the Pt film 3 may be used with no particular limitation. Examples of the adhesiveness improving film 2 include a Ti film and a Cr film. For example, the Ti film can form TiSi with Si or form TiSi or TiC with SiC, and thus adhesiveness to the semiconductor wafer is increased. The "Ti film" as used herein means a metal film containing Ti as a main component, and preferably means a metal film containing 99 mass % or more of Ti, with the balance being inevitable impurities. In addition, the "Cr film" as used herein means a metal film containing Cr as a main component, and preferably means a metal film containing 99 mass % or more of Cr, with the balance being inevitable impurities.

The thickness of the adhesion-improving film 2 is not particularly limited as long as the thickness falls within a range in which the adhesiveness between the semiconductor wafer and the Pt film 3 can be increased, and is generally about 100 nm.

The Pt film 3 and the Sn film 4 to be formed on the adhesion-improving film 2 are metal films that form the joining portion 8 at the time of joining. The "Pt film 3" as used herein means a metal film containing Pt as a main component, and preferably means a metal film containing 99 mass % or more of Pt, with the balance being inevitable impurities. In addition, the "Sn film 4" as used herein means a metal film containing Sn as a main component, and preferably means a metal film containing 99 mass % or more of Sn, with the balance being inevitable impurities.

The Au film 5 to be formed on the Sn film 4 is formed for preventing underlying films (the Pt film 3 and the Sn film 4) from being oxidized or sulfurized before joining, and is a metal film that forms the joining portion 8 at the time of joining. The "Au film 5" as used herein means a metal film containing Au as a main component, and preferably means a metal film containing 99 mass % or more of Au, with the balance being inevitable impurities.

In a metal laminated film formed of the Pt film 3, the Sn film 4, and the Au film 5, the content of the Pt film 3 is 5 mass % or more and less than 10 mass %, preferably 5 mass % or more and 9 mass % or less. When the content of the Pt film 3 is less than 5 mass %, the joining portion 8 cannot achieve a high melting point, and hence cannot withstand a high temperature of 250° C. Meanwhile, when the content of the Pt film 3 is more than 10 mass %, Pt is liable to form a hard and fragile alloy layer with Sn. As a result, the stress relaxation properties of the joining portion 8 become poor, and the joint reliability of the joining portion 8 is reduced.

Herein, the content of each film in the metal laminated film can be determined as described below. The density (g/cm$^3$) of each film to be formed through vapor deposition is determined in advance, the mass (g) of each film is calculated from the thickness of each film (cm$^3$) formed, and the content of each film is calculated by dividing the mass of each film by the mass of the metal laminated film.

The content of the Au film 5 in the metal laminated film is 51 mass % or more and less than 75 mass %, preferably 51 mass % or more and 73 mass % or less. When the content of the Au film 5 is less than 51 mass %, the joining portion 8 cannot achieve a high melting point, and hence cannot withstand a high temperature of 250° C. Meanwhile, when the content of the Au film 5 is more than 75 mass %, Au is liable to form a hard and fragile alloy layer with Sn. As a result, the stress relaxation properties of the joining portion 8 become poor, and the joint reliability of the joining portion 8 is reduced.

The content of the Sn film 4 in the metal laminated film corresponds to the balance, and is preferably 19 mass % or more and 44 mass % or less.

The thicknesses of the Pt film 3, the Sn film 4, and the Au film 5 are not particularly limited as long as the contents of those films in the metal laminated film fall within the above-mentioned ranges. In general, the thickness of the Pt film 3 is 0.2 μm or more and 0.9 μm or less. In addition, the thickness of the Sn film 4 is 5 μm or more and 11 μm or less. In addition, the thickness of the Au film 5 is 3 μm or more and 9 μm or less.

The thickness of the metal laminated film (the total thickness of the Pt film 3, the Sn film 4, and the Au film 5) is not particularly limited, but is preferably 5 μm or more and 15 or less. When the metal laminated film having such a thickness is formed, the semiconductor wafer on which the metal laminated film is formed through vapor deposition can be diced without a defect, for example, chipping, resulting in an increase in mass production properties.

A vapor deposition method for the adhesion-improving film 2, the Pt film 3, the Sn film 4, and the Au film 5 on the semiconductor wafer is not particularly limited, and any method known in the art may be used. Examples of the vapor deposition method include physical vapor deposition (PVD) and chemical vapor deposition (CVD). The conditions of the vapor deposition may appropriately be set depending on a vapor deposition method and a vapor deposition device to be used. For example, the vapor deposition rate of each metal is determined in advance, and depending on the thickness or content of each film, a vapor deposition time period may be calculated from the vapor deposition rate.

The Sn film 4 may be formed through use of a solder material containing Sn as a main component. In addition, the metal films each having been formed into a film through vapor deposition may be subjected to heat treatment in a temperature range of from room temperature to 200° C. for a freely-selected time period. Through such heat treatment, a metal in an amorphous state is partially crystallized, and hence internal strain generated in the metal films at the time of film formation can be removed. Further, a metal diffusion reaction occurs between the adjacent metal films, and hence adhesion strength between the adjacent metal films can also be increased.

The dicing method for the semiconductor wafer is not particularly limited, and any method known in the art may be used. Specifically, the semiconductor wafer may be diced into a predetermined size with a laser, a blade, or the like.

Meanwhile, as illustrated in FIG. 1A, the Ni film 7 and the Au film 5 are sequentially formed on the substrate 6.

The substrate 6 is not particularly limited, and may be various members each required to be joined to the semiconductor element 1. Examples of the substrate 6 include a circuit board, for example, a DBC substrate, a metal plate, and a ceramics plate.

The Ni film 7 to be formed on the substrate 6 is a metal film required for joining the substrate 6 to the joining portion 8. The "Ni film 7" as used herein means a metal film containing Ni as a main component, and preferably means a metal film containing 99 mass % or more of Ni, with the balance being inevitable impurities.

The thickness of the Ni film 7 is not particularly limited as long as the thickness falls within a range in which the substrate 6 can be joined to the joining portion 8, and is generally 0.2 µm or more and 5.0 µm or less.

The Au film 5 to be formed on the Ni film 7 is formed for preventing an underlying film (the Ni film 7) from being oxidized or sulfurized before joining, and is a metal film that forms the joining portion 8 at the time of joining.

The thickness of the Au film 5 is not particularly limited as long as the thickness falls within a range in which the underlying film (the Ni film 7) can be prevented from being oxidized or sulfurized, and is generally 0.2 µm or more and 5.0 µm or less.

As illustrated in FIG. 1B, the semiconductor element 1 and the substrate 6 each having formed thereon the metal films are laminated on each other so that the Au film 5 formed on the semiconductor element 1 and the Au film 5 formed on the substrate 6 face each other, and the Au films 5 are joined to each other through heating to thus, form the joining portion 8.

The lamination method and heating method are not particularly limited, and any method known in the art may be used. For example, it is appropriate to arrange the substrate 6 having formed thereon the metal films on a hot plate, laminate thereon the semiconductor element 1 having formed thereon the metal films, and then heat the hot plate.

The heating conditions may be appropriately set depending on the heating device to be used, the thicknesses of the metal films, and the like, and are not particularly limited. In general, the heating may be performed at a temperature of 220° C. or more and 350° C. or less for 1 minute.

After the formation of the joining portion 8, the heating is stopped, and cooling is performed, so that the semiconductor device can thus be obtained. As the cooling, there is no need to adopt forced cooling, and it is appropriate to adopt natural cooling.

In the method of manufacturing a semiconductor device according to this embodiment, the films are formed on the semiconductor element 1 and the substrate 6 through vapor deposition. Thus, the films can be formed uniformly and thinly and production stability is high as compared to a case of adopting any other method, for example, printing. In addition, the films are formed on the semiconductor wafer through vapor deposition, and hence vapor deposition cost per semiconductor element 1 can be reduced.

In addition, the semiconductor element 1 and the substrate 6, in each of which the Au film 5 is formed on an outermost surface, are used, and hence at the time of joining of the semiconductor element 1 and the substrate 6, the underlying films for the Au films 5 can be prevented from being oxidized or sulfurized. Accordingly, at the time of joining of the semiconductor element 1 and the substrate 6, the heating can be performed in an air atmosphere, and an expensive heating furnace or the like is not required.

Further, at the time of joining, the Pt film 3, the Sn film 4, and the Au film 5 formed on the semiconductor element 1 and the Au film 5 and part of the Ni film 7 formed on the substrate 6 are dissolved only through the heating, and thus the joining portion 8, which is excellent in joint reliability and can withstand a high temperature of 250° C., can be formed. Specifically, Au and Pt each having a melting point higher than the melting point of Sn are diffused into and dissolved in Sn, and the joining portion 8 having a melting point higher than the melting point (232° C.) of Sn is formed. Therefore, the mass production properties of the semiconductor device are increased without the necessity for pressurization.

In the semiconductor device produced as described above, as illustrated in FIG. 1C, the substrate 6 and the semiconductor element 1 are joined to each other via the joining portion 8. The Ni film 7 is formed between the substrate 6 and the joining portion 8, and the adhesion-improving film 2 is formed between the semiconductor element 1 and the joining portion 8.

The joining portion 8 is formed of an alloy layer containing Pt, Au, and Sn. In addition, the joining portion 8 further contains Ni because part of the Ni film 7 is dissolved therein.

In the joining portion 8, the content of Pt is 4.6 mass % or more and less than 8.4 mass %, the content of Au is 46.8 mass % or more and less than 68.3 mass %, and the content of Sn is 16.5 mass % or more and less than 40.5 mass %. Unless the contents of the above-mentioned components are outside the above-mentioned ranges, the joint reliability of the joining portion 8 is reduced. The content of Ni in the joining portion 8 is not particularly limited, but is preferably 5 mass % or more and 8.5 mass % or less.

The composition of the joining portion 8 (the contents of the above-mentioned components) may be determined by cutting the joining portion 8, and analyzing the resultant cross section by energy dispersive X-ray spectrometry (EDS).

EXAMPLES

The present invention is described in detail by way of Examples, which by no means limit the present invention.

Examples 1 to 10 and Comparative Examples 1 to 12

A Ti film, a Pt film, a Sn film, and a Au film were sequentially formed on an 8-inch SiC wafer through physical vapor deposition (PVD). Herein, the thickness of the Ti film was set to 100 nm, and the thicknesses of the Pt film, the Sn film, and the Au film were set as shown in Table 1. The thickness of each film was controlled by adjusting a vapor deposition time period. After that, the SiC wafer was subjected to cut processing by pressing a diamond blade against the SiC wafer, and thus was diced into 10 mm squares. Thus, a semiconductor element was obtained. At this time, it was confirmed that defects, for example, chipping, did not occur through the dicing. In addition, the density of each of the Pt film, the Sn film, and the Au film to be formed through PVD was measured in advance (Pt film: 21.45 g/cm$^3$, Sn film: 7.30 g/cm$^3$, Au film: 19.32 g/cm$^3$), and the mass of each film was calculated from the thickness of each film shown in Table 1. After that, the content of each film in a metal laminated film formed of the Pt film, the Sn film, and the Au film was calculated therefrom. The results are shown in Table 1.

TABLE 1

| | Content (mass %) | | | Thickness (µm) | | |
|---|---|---|---|---|---|---|
| | Pt film | Sn film | Au film | Pt film | Sn film | Au film |
| Comparative Example 1 | <u>4</u> | 46 | <u>50</u> | 0.31 | 10.41 | 4.28 |
| Comparative Example 2 | <u>4</u> | 45 | 51 | 0.31 | 10.28 | 4.40 |
| Comparative Example 3 | <u>4</u> | 36 | 60 | 0.34 | 9.00 | 5.66 |
| Comparative Example 4 | <u>4</u> | 23 | 73 | 0.39 | 6.64 | 7.97 |
| Comparative Example 5 | <u>4</u> | 21 | <u>75</u> | 0.40 | 6.21 | 8.38 |
| Comparative Example 6 | 5 | 45 | <u>50</u> | 0.39 | 10.29 | 4.32 |
| Example 1 | 5 | 44 | 51 | 0.39 | 10.16 | 4.45 |
| Example 2 | 5 | 35 | 60 | 0.43 | 8.84 | 5.73 |
| Example 3 | 5 | 22 | 73 | 0.50 | 6.43 | 8.07 |
| Comparative Example 7 | 5 | 20 | <u>75</u> | 0.51 | 6.00 | 8.49 |

TABLE 1-continued

|  | Content (mass %) | | | Thickness (μm) | | |
| --- | --- | --- | --- | --- | --- | --- |
|  | Pt film | Sn film | Au film | Pt film | Sn film | Au film |
| Comparative Example 8 | 7 | 43 | <u>50</u> | 0.56 | 10.04 | 4.41 |
| Example 4 | 7 | 42 | 51 | 0.56 | 9.90 | 4.54 |
| Example 5 | 7 | 33 | 60 | 0.62 | 8.53 | 5.86 |
| Example 6 | 7 | 20 | 73 | 0.72 | 6.00 | 8.28 |
| Comparative Example 9 | 7 | 18 | <u>75</u> | 0.73 | 5.54 | 8.72 |
| Comparative Example 10 | 8 | 42 | <u>50</u> | 0.64 | 9.90 | 4.45 |
| Example 7 | 8 | 41 | 51 | 0.65 | 9.76 | 4.59 |
| Example 8 | 8 | 32 | 60 | 0.71 | 8.36 | 5.93 |
| Example 9 | 8 | 19 | 73 | 0.83 | 5.78 | 8.39 |
| Comparative Example 11 | 8 | 17 | <u>75</u> | 0.85 | 5.31 | 8.84 |
| Comparative Example 12 | 9 | 41 | <u>50</u> | 0.73 | 9.77 | 4.50 |
| Example 10 | 9 | 40 | 51 | 0.74 | 9.63 | 4.64 |

(Remark)
The underlines represent conditions outside the range of the present disclosure.

Next, a Ni film and a Au film were sequentially formed through PVD on a DBC substrate in which Cu plates were joined to both surfaces of a $Si_3N_4$ plate with a brazing filler metal containing Ag as a main component ($Si_3N_4$ plate: thickness: 0.32 mm, size: 21 mm square, Cu plate: thickness: 0.8 mm, size: 20 mm square). Herein, the thicknesses of the Ni film and the Au film were set to 1,000 nm and 500 nm, respectively.

Next, the DBC substrate on which the Ni film and the Au film were formed was placed on a hot plate heated to 280° C., and then the semiconductor element on which the Ti film, the Pt film, the Sn film, and the Au film were formed was laminated on the DBC substrate. At this time, the semiconductor element and the DBC substrate were laminated on each other so that the Au film formed on the semiconductor element and the Au film formed on the DBC substrate faced each other. The Au films were joined to each other by leaving the resultant laminate to stand without pressurization under an air atmosphere for 10 seconds. After that, the laminate was removed from the hot plate, and naturally cooled.

Each sample obtained as described above was evaluated for the composition of a joining portion, initial joining properties, and joint reliability.

The composition of a joining portion was determined by cutting the joining portion, and analyzing the resultant cross section by energy dispersive X-ray spectrometry (EDS). The analysis was performed at 5 points in the joining portion, and an average value thereof was shown as a result. The composition of the joining portion (contents of Pt, Au, Sn, and Ni) obtained through the analysis is shown in Table 2.

The initial joining properties were evaluated as described below. Void generation states in the joining portion were measured with a scanning acoustic tomograph (SAT) serving as a non-destructive inspection device, and a porosity was calculated through binarization of the resultant image. In this evaluation, the number of evaluation samples was set to 30 in each of Examples and Comparative Examples, and a case in which all the samples had a porosity of 5% or less was evaluated as "o", and a case in which any one of the samples had a porosity of more than 5% was evaluated as "x". The results are shown in Table 2.

Figure 2:
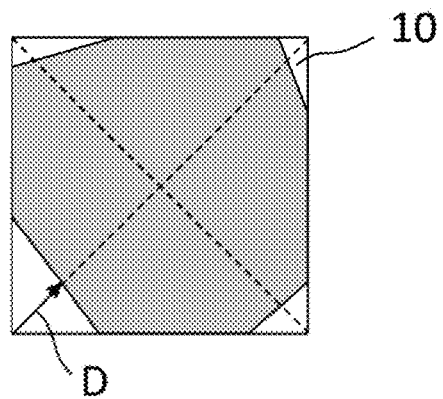
FIG. 2 is a view for illustrating an evaluation method for joint reliability.

The joint reliability was evaluated as described below. A temperature cycle test in which a temperature was repeatedly reciprocated between −55° C. (retained for 15 minutes) and 250° C. (retained for 15 minutes) was performed with a thermal shock test device, and after 600 cycles, the length of a crack generated at an edge portion of each sample was measured with a scanning acoustic tomograph (SAT). Specifically, as illustrated in FIG. 2, diagonal lines were drawn on the resultant SAT image, and the length of a crack 10 (illustrated in white) along each of the diagonal lines was measured. In the measurement, the number of evaluation samples was set to 30 in each of Examples and Comparative Examples, and a case in which all the samples had a maximum crack length D of 1 mm or less was evaluated as "o", and a case in which any one of the samples had a maximum crack length D of more than 1 mm was evaluated as "x". The results are shown in Table 2.

TABLE 2

|  | Composition of joining portion (mass %) | | | | Initial joining property | Joint reliability |
| --- | --- | --- | --- | --- | --- | --- |
|  | Pt | Sn | Au | Ni | | |
| Comparative Example 1 | <u>3.7</u> | <u>42.6</u> | <u>46.3</u> | 7.4 | o | x |
| Comparative Example 2 | <u>3.7</u> | <u>42.1</u> | 47.7 | 6.5 | o | x |
| Comparative Example 3 | <u>3.8</u> | 34.0 | 56.6 | 5.7 | o | x |
| Comparative Example 4 | <u>3.7</u> | 21.1 | 67.0 | 8.3 | o | x |
| Comparative Example 5 | <u>3.7</u> | 19.4 | <u>69.4</u> | 7.4 | o | x |
| Comparative Example 6 | 4.7 | <u>42.5</u> | 47.2 | 5.7 | o | x |
| Example 1 | 4.6 | 40.4 | 46.8 | 8.3 | o | o |
| Example 2 | 4.6 | 32.1 | 55.0 | 8.3 | o | o |
| Example 3 | 4.6 | 20.2 | 67.0 | 8.3 | o | o |
| Comparative Example 7 | 4.6 | 18.5 | <u>69.4</u> | 7.4 | o | x |
| Comparative Example 8 | 6.5 | 40.2 | <u>46.7</u> | 6.5 | o | x |
| Example 4 | 6.5 | 39.3 | 47.7 | 6.5 | o | o |
| Example 5 | 6.6 | 31.1 | 56.6 | 5.7 | o | o |
| Example 6 | 6.5 | 18.5 | 67.6 | 7.4 | o | o |
| Comparative Example 9 | 6.5 | 16.7 | <u>69.4</u> | 7.4 | o | x |
| Comparative Example 10 | 7.4 | 38.9 | <u>46.3</u> | 7.4 | o | x |
| Example 7 | 7.3 | 37.6 | 46.8 | 8.3 | o | o |
| Example 8 | 7.5 | 30.2 | 56.6 | 5.7 | o | o |
| Example 9 | 7.5 | 17.8 | 68.2 | 6.5 | o | o |
| Comparative Example 11 | 7.3 | <u>15.6</u> | <u>68.8</u> | 8.3 | o | x |
| Comparative Example 12 | 8.3 | 38.0 | <u>46.3</u> | 7.4 | o | x |
| Example 10 | 8.3 | 37.0 | 47.2 | 7.4 | o | o |

(Remark)
The underlines represent conditions outside the range of the present disclosure.

As shown in Table 2, the samples of Examples 1 to 10 each had a joining portion excellent in initial joining properties and joint reliability, whereas the samples of Comparative Examples 1 to 12 each had a joining portion having insufficient joint reliability.

As can be seen from the results described above, according to the present disclosure, a semiconductor device that has high mass production properties and is excellent in joint reliability even at a high temperature of 250° C., and a method of manufacturing the semiconductor device can be provided.

A description has been given of a case of joining the semiconductor element and the substrate. The joining method in the present disclosure is not limited to the case of joining the semiconductor element and the substrate and is applicable to various applications. Specifically, the joining is also applicable to a case of joining a magnetic material to a metal plate. In addition, the joining may also be applicable for hermetic sealing portions in applications such as hermetic packages that are strictly sealed against outgases.

It should be noted that the present international application claims priority based on Japanese Patent Application No. 2016-132321 filed on Jul. 4, 2016, the contents of which are incorporated herein by reference in their entirety.

REFERENCE SIGNS LIST 1 semiconductor element
2 adhesion-improving film

3 Pt film
4 Sn film
5 Au film
6 substrate
7 Ni film
8 joining portion
10 crack
D maximum crack length

The invention claimed is:

1. A method of manufacturing a semiconductor device, comprising the steps of:
sequentially forming an adhesion-improving film, a Pt film, a Sn film, and an Au film on a semiconductor wafer through vapor deposition so that a metal laminated film formed of the Pt film, the Sn film, and the Au film includes 5 mass % or more and less than 10 mass % of the Pt film and 51 mass % or more and less than 75 mass % of the Au film, with the balance being the Sn film with the proviso that the total mass of the metal laminated film is 100 mass %;
dicing the semiconductor wafer to obtain a semiconductor element;
sequentially forming a Ni film and a Au film on a substrate through vapor deposition; and
laminating the semiconductor element and the substrate so that the Au film formed on the semiconductor element and the Au film formed on the substrate face each other, followed by joining the semiconductor element and the substrate through heating.

2. A method of manufacturing a semiconductor device according to claim 1, wherein the adhesion-improving film is a Ti film.

3. A method of manufacturing a semiconductor device according to claim 1, wherein the metal laminated film has a thickness of 5 µm or more and 15 µm or less.

4. A method of manufacturing a semiconductor device according to claim 2, wherein the metal laminated film has a thickness of 5 µm or more and 15 µm or less.

5. A method of manufacturing a semiconductor device according to claim 1, wherein the semiconductor wafer is a SiC wafer.

6. A method of manufacturing a semiconductor device according to claim 2, wherein the semiconductor wafer is a SiC wafer.

7. A method of manufacturing a semiconductor device according to claim 3, wherein the semiconductor wafer is a SiC wafer.

8. A method of manufacturing a semiconductor device according to claim 1, wherein the substrate is a DBC substrate.

9. A method of manufacturing a semiconductor device according to claim 2, wherein the substrate is a DBC substrate.

10. A method of manufacturing a semiconductor device according to claim 3, wherein the substrate is a DBC substrate.

11. A method of manufacturing a semiconductor device according to claim 5, wherein the substrate is a DBC substrate.

12. A semiconductor device, comprising a substrate and a semiconductor element joined to each other via a joining portion,
wherein the semiconductor device has a Ni film formed between the substrate and the joining portion and an adhesion-improving film formed between the semiconductor element and the joining portion, and
wherein the joining portion includes 46.8 mass % or more and less than 68.3 mass % of Au, and 16.5 mass % or more and less than 40.5 mass % of Sn, and 4.6 mass % or more and 8.3 mass % or less of Pt, with the balance being Ni with the proviso that the total mass of the joining portion is 100 mass %.

13. A semiconductor device according to claim 12, wherein the adhesion-improving film is a Ti film.

14. A semiconductor device according to claim 12, wherein the semiconductor wafer material which is a constituent member of the semiconductor element is SiC.

15. A semiconductor device according to claim 13, wherein the semiconductor wafer material which is a constituent member of the semiconductor element is SiC.

16. A semiconductor device according to claim 12, wherein the substrate is a DBC substrate.

17. A semiconductor device according to claim 13, wherein the substrate is a DBC substrate.

18. A semiconductor device according to claim 14, wherein the substrate is a DBC substrate.

* * * * *